United States Patent
Lee et al.

(10) Patent No.: US 7,209,356 B2
(45) Date of Patent: Apr. 24, 2007

(54) HEAT DISSIPATION DEVICE

(75) Inventors: Hsieh Kun Lee, Tu-Chen (TW); Wan Lin Xia, Shenzhen (CN); HeBen Liu, Shenzhen (CN)

(73) Assignees: Fu Zhun Precision Ind? (Shenzhen) Co., Ltd., Shenzhen (CN); Foxconn Technology Co., Ltd., Tu-Cheng (TW)

( * ) Notice: Subject to any disclaimer, the term of this patent is extended or adjusted under 35 U.S.C. 154(b) by 318 days.

(21) Appl. No.: 10/921,405

(22) Filed: Aug. 18, 2004

(65) Prior Publication Data

US 2006/0039117 A1 Feb. 23, 2006

(30) Foreign Application Priority Data

Nov. 11, 2003 (CN) .............................. 92219939 U

(51) Int. Cl.
*H05K 7/20* (2006.01)
(52) U.S. Cl. ................. 361/719; 361/687; 361/704; 361/715; 165/46; 165/104.21; 174/15.2
(58) Field of Classification Search ................. 361/686, 361/687, 690–697, 698–699, 700–719, 724–727, 361/802, 803; 257/706–727; 174/15.1, 174/16.3, 252; 165/80.2, 80.3, 104.33, 104.21, 165/104.34, 104.32, 185, 106.33, 121, 122–126; 654/184
See application file for complete search history.

(56) References Cited

U.S. PATENT DOCUMENTS 5,978,223 A * 11/1999 Hamilton et al. ........... 361/704

| | | | |
|---|---|---|---|
| 6,052,285 A | 4/2000 | Hileman | |
| 6,331,937 B1* | 12/2001 | Bartyzel | 361/687 |
| 6,356,444 B1 | 3/2002 | Pedoeem | |
| 6,671,177 B1 | 12/2003 | Han | |
| 6,778,390 B2* | 8/2004 | Michael | 361/695 |
| 6,882,536 B2* | 4/2005 | Deeney et al. | 361/719 |
| 6,937,474 B2* | 8/2005 | Lee | 361/715 |
| 7,019,974 B2* | 3/2006 | Lee et al. | 361/700 |
| 2003/0189815 A1 | 10/2003 | Lee | |
| 2004/0173901 A1* | 9/2004 | Mallik et al. | 257/738 |
| 2005/0061477 A1* | 3/2005 | Mira | 165/80.3 |

FOREIGN PATENT DOCUMENTS

| TW | 532743 | 5/2003 |
|---|---|---|
| TW | 543841 | 7/2003 |

* cited by examiner

*Primary Examiner*—Michael Datskovskiy
(74) *Attorney, Agent, or Firm*—Wei Te Chung

(57) ABSTRACT

A heat dissipation device includes a first heat sink (10) mounted on one side of a video graphics adapter (VGA) card (70) on which a heat generating component is mounted to dissipate heat generated by the heat generating componnent, a second heat sink (10') mounted on an opposite side of the card, a pair of heat pipes (40) independent from and intercrossed with each other and connected between the first and second heat sinks for transferring heat from the first heat sink to the second heat sink, a pair of covers (26) attached on the respective first and second heat sinks to form enclosed channels (15) between the covers and the first and second heat sinks respectively, a pair of fans (22) mounted between the covers and the first and second heat sinks for producing airflow through the channels to improve heat dissipation efficiency of the heat dissipation device.

18 Claims, 3 Drawing Sheets

HEAT DISSIPATION DEVICE

BACKGROUND OF THE INVENTION

1. Field of the Invention

The present invention relates to a heat dissipation device for electronic devices, and particularly to a heat dissipation device for a graphics card apparatus.

2. Prior Art

In order to enable desktop and other computers to rapidly process graphics and game technology, add-on units generally referred to as "graphics cards" or "VGA cards" are often installed in computer devices. Such cards include a separate processor, called a GPU, one or more memory chips and other required circuitry, all mounted to a circuit board. Such cards often have extremely large computing power and, as a consequence, generate substantial heat that if not dissipated will adversely affect operation of the graphics cards. Thus, a heat dissipation device is often attached to a top surface of a GPU to remove heat therefrom.

FIG. 3 shows a conventional heat dissipation device for VGA cards. The heat dissipation device comprises a pair of heat sinks 1, 2 and a pair of heat pipes 7. Each heat sink 1, 2 comprises a base 3, 4 defining holes 8 therethrough, and a plurality of fins 5, 6 extending from the base 3, 4. The pair of heat sinks 1, 2 are stacked each other and the first heat sink 1. is for being attached to the VGA cards. The heat pipes 7 are connected between the pair of heat sinks 1, 2 via opposite ends thereof received in the holes 8 for transferring heat from the first heat sink 1 to the second heat sink 2. However, the two heat sinks 1, 2 are stacked on one side of the VGA cards and have a great height, which results in the heat sinks 1, 2 apt to interfere with other electronic components in a computer device. Furthermore, the two heat sinks 1, 2 are stacked on one side of the VGA cards and unbalance weight is therefore exerted in opposite sides of the VGA cards, which results in the VGA cards easy to loose from connector ports of a circuit board in the computer device.

SUMMARY OF THE INVENTION

Accordingly, an object of the present invention is to provide a heat dissipation device which occupies a space with a small height.

A further object of the present invention is to provide a heat dissipation device which can efficiently dissipate heat from an electronic component.

To achieve the above-mentioned objects, a heat dissipation device in accordance with the present invention comprises a first heat sink mounted on one side of a VGA card on which a heat generating componnent is mounted to dissipate heat generated by the heat generating componnent, a second heat sink mounted on an opposite side of the card, a pair of heat pipes independent from and intercrossed with each other and connected between the first and second heat sinks for transferring heat from the first heat sink to the second heat sink, a pair of covers attached on the respective first and second heat sinks to form enclosed channels between the covers and the first and second heat sinks respectively, a pair of fans mounted between the covers and the first and second heat sinks for producing airflow through the channels to improve heat dissipation efficiency of the heat dissipation device.

Other objects, advantages and novel features of the present invention will be drawn from the following detailed description of a preferred embodiment of the present invention with attached drawings, in which:

DETAILED DESCRIPTION OF THE INVENTION

Figure 1:
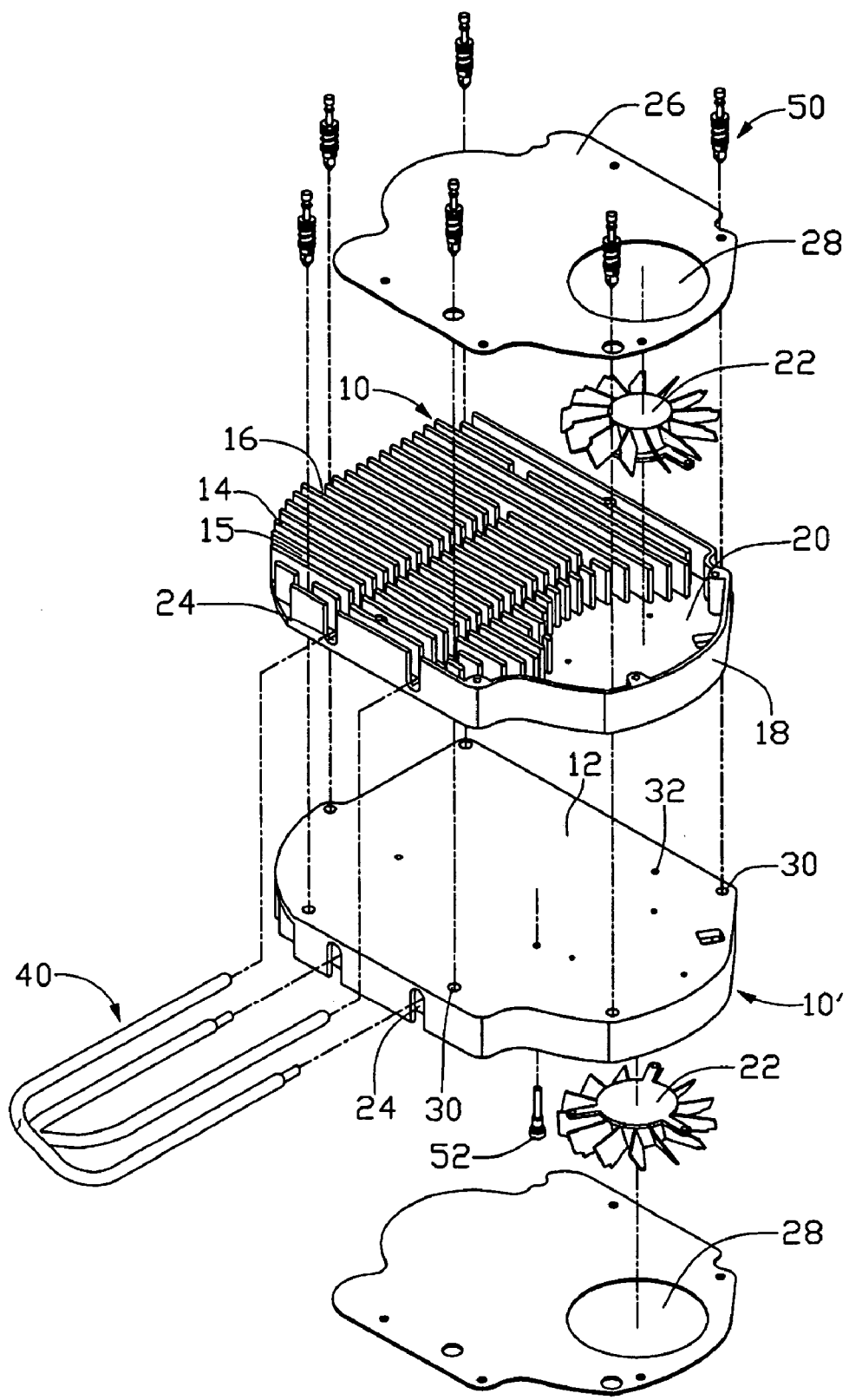
FIG. 1 is an exploded, isometric view of a heat dissipation device in accordance with a preferred embodiment of the present invention.

Referring to FIG. 1, a heat dissipation device in accordance with the preferred embodiment of the present invention comprises a first heat sinks 10, a second heat sink 10', a pair of covers 26, and a pair of heat pipes 40.

The pair of hat sinks 10, 10' have mirroring structures with each other. For simplifying illustration, the following illutsration takes the first haet sink 10 as an example. The first heat sink 10 comprises a base 12, and a plurality of spaced parallel fins 14 arranged on the base 12. A plurality of longituinal channels 15 is formed between adjacent fins 14. A wall 18 is formed on a peripheral edge of the base 12 and surrounds the fins 14 except an outlet 16 formed at ends of the fins 14. The outlet 16 aligns with the channels 15. A space 20 if formed between the wall 18 and opposit ends of the fins 14 opposing the outlet 16 for recieving a fan 22 therein. A plurality of through holes 30 is defined in thebase 12 adjacent to the periphery of the base 12 for extention of pins 50 therethrough. A plurality of screw holes 32 is defined in base 12 for extention of screws 52 therethrough. A pair of slots 24 is defined in the fins 14 transverse to the channels 15 for receving the pair of heat pipes 40 therein.

Each cover 26 has a profile corresponding to the profile of the base and attached on the heat sink 10. The cover 26 cooperative with the base 12 encloses portions of the channels 15 adjacent the fan 22. The cover 26 defines an aperture 28 for exposing the fan 22.

The heat pipes 40 are U-shaped and opposite ends thereof are respectively fixedly received in the slots 24 of the corresponding heat sinks 10, 10' by soldering or other means. Thus, the pair of heat sinks 10, 10' are combined to a single unit with a gap 60 formed between the bases 12 thereof for receiving a video graphics adapter card (VGA card) 70 (see FIG. 2) therein. Accordingly, the heat sinks 10, 10' are mirror images of each other on opposite sides of the video graphics adapter card 70.

Figure 2:
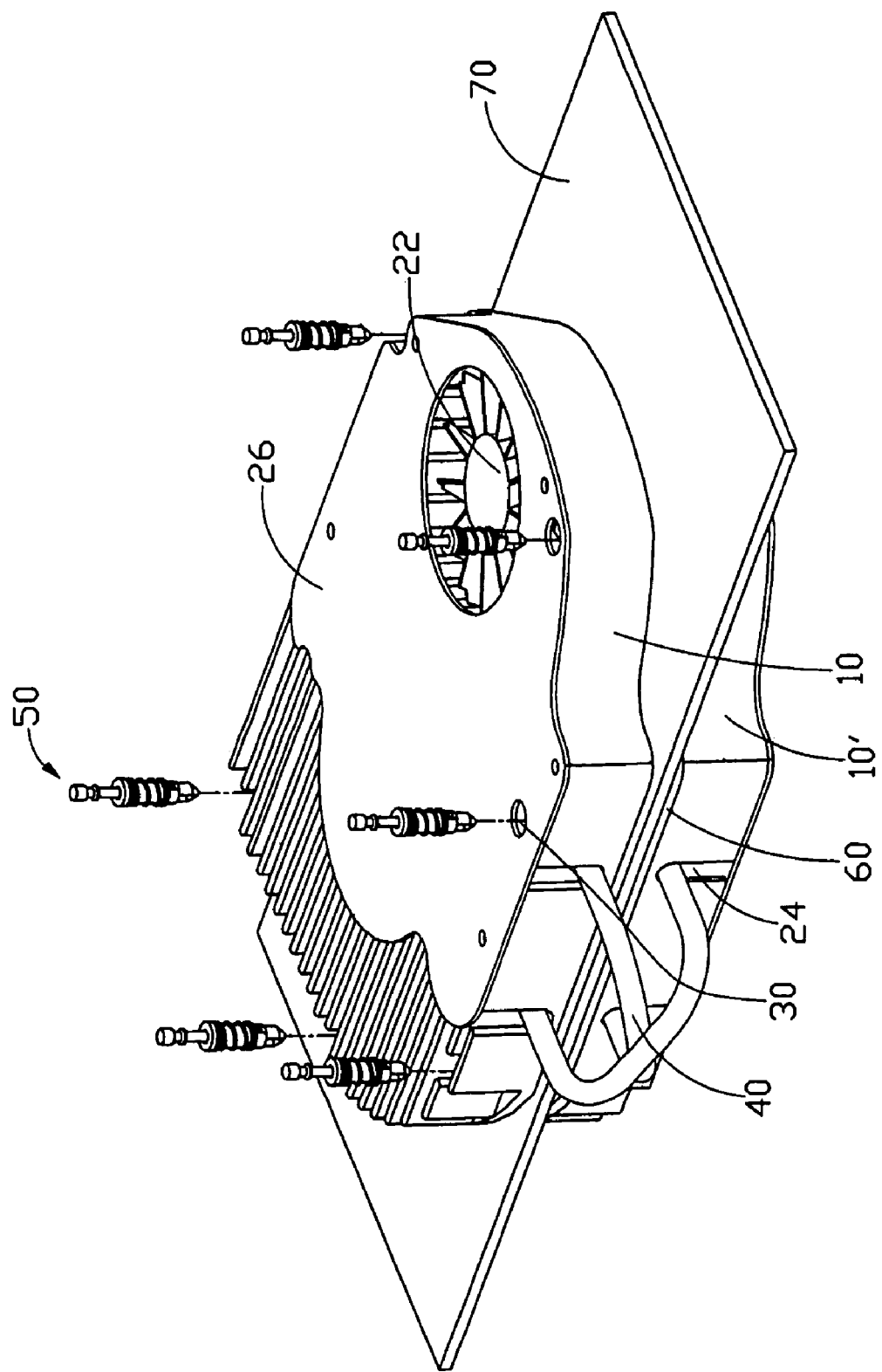
FIG. 2 is an assembled view the heat dissipation device of FIG. 1 mounted on a VGA card.
Figure 3:
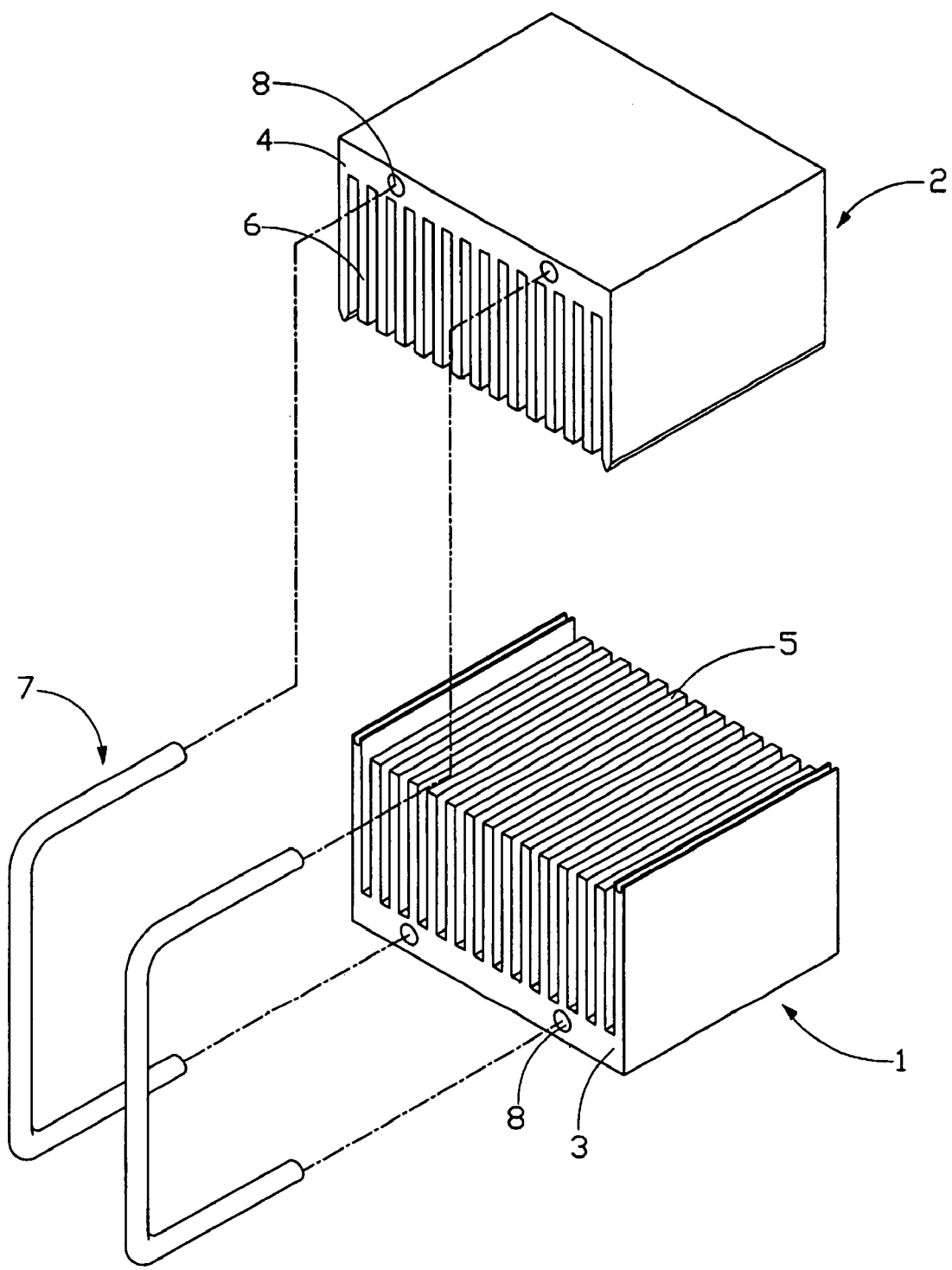
FIG. 3 is an exploded, isometric view of a conventional heat dissipation device.

Referring to FIG. 2, the VGA card 70 has a plurality of electronic components (not visible) mounted on one face thereof. In assembly, the combined first and second heat sinks 10, 10' are attached to the VGA card 70 with the VGA card 70 sandwiched between the combined first and second heat sinks 10, 10'. The base 12 of the first heat sink 10 contacts one of the electronic components. The base 12 of the second heat sink 10' contacts an opposite face of the VGA card 70. The pins 50 are sequentially extended through the through holes 30 of the first heat sink 10, the VGA card 70 and the through holes 30 of the second heat sink 10'. The screws 52 are extended through the through holes 32 of the first heat sink 10, the VGA card 70 and the through holes 32 of the second heat sink 10'. The combined first and second heat sinks 10, 10' are therefore firmly secured to the VGA card 70.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A heat dissipation device assembly comprising:
   an electronic card with an electronic component mounted thereon;
   a first heat sink arranged on one face of the card and thermal contacting the electronic component, the first heat sink comprising a base contacting the electronic component and a plurality fins arranged on the base;
   a second heat sink arranged on an opposite face of the card;
   heat transferring means connected between the first heat sink and the second heat sink so as to transfer heat from the first heat sink to the second heat sink; and
   a fan mounted in one of the first heat sink and the second heat sink for improving heat dissipation efficiency of the heat dissipation device;
   wherein the heat transferring means comprises two heat pipes which are intercrossed with each other and fixedly received in said first and second heat sinks, and wherein one of the heat pipes is attached on the base and transverse to the fins of the first heat sink.

2. The heat dissipation device assembly as claimed in claim 1, wherein the first heat sink defines a plurality of channels formed between the fins and the fan is mounted within the first hear sink at one end thereof for producing airflow through the channels.

3. The heat dissipation device assembly as claimed in claim 1, wherein the first heat sink further comprises a wall formed on a peripheral edge of the base surrounding the fins and the fan except an outlet formed at an opposite end of the first heat sink.

4. The heat dissipation device assembly as claimed in claim 3, wherein the first heat sink further comprises a cover having a profile corresponding to and attached on the base for covering the fins with the fan exposed.

5. The heat dissipation device assembly as claimed in claim 4, wherein the second heat sink has a mirroring structure with the first heat sink.

6. The heat dissipation device assembly as claimed in claim 5, wherein each of the first and second heat sinks further defines a pair of slots transverse to the channels, and end portions of the heat pipes are fixedly received in said slots.

7. A heat dissipation device for cooling a heat generating component mounted on one side of a video graphics adapter card, the heat dissipation device comprising:
   a first heat sink mounted on the same side as the beat generating component to dissipate heat generated by the heat generating component;
   a second heat sink mounted on a second side of the card opposite to the first heat sink; and
   a pair of heat pipes independent from and intercrossed with each other and connected between the first and second heat sinks for transferring heat from the first heat sink to the second heat sink;
   wherein the heat are arranged transverse to channels defined in the first and second heat sinks.

8. The heat dissipation device as claimed in claim 7, further comprising a fan mounted in the first heat sink, wherein the fan is shorter than a top of the first heat sink in a direction perpendicular to the card.

9. The heat dissipation device as claimed in claim 8, wherein the first heat sink comprises a base and a plurality of fins with the channels Conned therebetween, and wherein the fan is located at one end of the channels.

10. The heat dissipation device as claimed in claim 9, wherein the first heat sink further comprises a cover cooperatively with the base enclosing portions of the channels adjacent to fan but exposing the fan.

11. The heat dissipation device assembly as claimed in claim 1, wherein the first and second heat sinks each define a pair of slots therein, and wherein end portions of each of the first and second heat pipes are soldered in a corresponding slot of the first heat sink and a corresponding slot of the second heat sink.

12. The heat dissipation device assembly as claimed in claim 1 wherein the end portions of the heat pipes are oriented perpendicular to channels defined in the first and second heat sinks.

13. A heat dissipation device assembly comprising:
   a circuit board with an electronic component mounted thereon;
   a first heat sink arranged on one face of the board in thermal contact with the electronic component;
   a second heat sink arranged on an opposite face of the board;
   heat transferring means for transferring heat from the first heat sink to the second heat sink;
   one cover parallel to the board attached on one of the first and second heat sinks to form enclosed channels between the cover and said one of the first and second heat sinks; and
   a fan located between the cover and said one of the first and second heat sinks for producing airflow through the channels;
   wherein the heat transferring means comprises two heat pipes which are intercrossed with each other, mounted on the first and second heat sinks and transverse to the channels.

14. The heat dissipation device assembly as claimed in claim 13, wherein each of the first and second heat sinks comprises a base and a plurality of fins extending from the base, the enclosed channels being formed between the fins, a wall formed on a peripheral edge of the base surrounding the fan and the enclosed channels.

15. The heat dissipation device assembly as claimed in claim 14, further comprising a plurality of screws extending through the bases of the first and second heat sinks and the board to secure the first and second heat sinks and the board together.

16. The beat dissipation device assembly as claimed in claim 15, further comprising a plurality of pins sequentially extending through the cover, the first heat sink, the board and the second heat sink for facilitating the screws to extend through the bases of the first and second heat sinks and the board.

17. The heat dissipation device assembly as claimed in claim 1, wherein another fan mounted in the other of the first heat sink and the second heat sink so that the first heat sink and the second heat sink are mirror images with each other.

18. The heat dissipation device assembly as claimed in claim 13, wherein middle portions of the heat pipes are intercrossed with each other at a lateral side of the circuit board.

* * * * *